United States Patent [19]

Ludington

[11] Patent Number: 4,536,658
[45] Date of Patent: Aug. 20, 1985

[54] HYBRID SCHOTTKY INFRARED FOCAL PLANE ARRAY

[75] Inventor: Charlotte E. Ludington, Sherborn, Mass.

[73] Assignee: The United States of America as represented by the Secretary of the Air Force, Washington, D.C.

[21] Appl. No.: 455,715

[22] Filed: Jan. 5, 1983

[51] Int. Cl.³ .............................. H01J 40/14
[52] U.S. Cl. ................. 250/578; 250/332; 357/15
[58] Field of Search ........... 357/15, 71, 29, 30, 357/32; 250/211 J, 578, 332, 330, 338

[56] References Cited

U.S. PATENT DOCUMENTS

| | | | |
|---|---|---|---|
| 3,808,435 | 4/1974 | Bate et al. | 250/332 |
| 3,902,066 | 8/1975 | Roosild et al. | 250/332 |
| 3,968,272 | 7/1976 | Anand | 357/15 |
| 3,973,146 | 8/1976 | Arnold et al. | 357/32 |
| 4,039,833 | 8/1977 | Thom | 250/332 |
| 4,064,533 | 12/1977 | Lampe et al. | 250/332 |
| 4,135,290 | 1/1979 | Evans, Jr. | 29/572 |
| 4,142,207 | 2/1979 | McCormack et al. | 250/332 |
| 4,143,269 | 3/1979 | McCormack et al. | 250/352 |
| 4,214,264 | 7/1980 | Hayward et al. | 358/44 |
| 4,350,886 | 9/1982 | Pommerrenig | 250/239 |
| 4,467,340 | 8/1984 | Rode et al. | 357/15 |

Primary Examiner—David C. Nelms
Attorney, Agent, or Firm—Donald J. Singer; Richard J. Donahue

[57] ABSTRACT

A two dimensional focal plane array of Schottky internal emission photodiodes which sense radiation in their metallic regions on a silicon substrate for infrared imaging. The array is designed for mating with multiplexing circuitry via hybrid bump bonding techniques.

1 Claim, 6 Drawing Figures

HYBRID SCHOTTKY INFRARED FOCAL PLANE ARRAY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to a sensing surface, or focal plane, for an infrared camera. More particularly, the present invention relates to a hybrid focal plane array formed of densely packed Schottky infrared internal emission photodiodes.

In U.S. Pat. No. 3,902,066, issued Aug. 26, 1975 to Roosild et al, there is described a monolithic Schottky barrier array for detecting the infrared portion of the electromagnetic spectrum. Individual Schottky electrodes within the array are connected through enhancement mode field effect transistors to charge coupled devices for providing signals to an infrared vidicon camera. The performance of this array has proven to be limited by aliasing and drop-out effects which are related to the low percentage active area of the array. Space is required within the focal plane for multiplexing the signals derived from the individual Schottky barrier electrodes, and also for the guard rings which are provided about each individual Schottky electrode. In such an array, the charge coupled device signal readout circuitry utilizes up to 50% of the focal plane area. Add to this losses of sensing area because of guard rings and channel stops and the active area of the array is reduced to approximately 30 to 45 percent of the total area of the array.

SUMMARY OF THE INVENTION

In accordance with the present invention, it has been found that Schottky internal photoemission focal plane mosaics, which sense infrared radiation via emission from a metallic electrode array and have 70% active area coverage can be realized by hybrid bump bonding to a separate integrated circuit multiplexer chip. Although such hybridization techniques have been successfully demonstrated in the bonding of multiplexer circuitry to arrays which sense infrared radiation in the semiconductor, as taught in U.S. Pat. No. 3,808,435 issued to Robert T. Bate et al, they have not been considered suitable for arrays which sense infrared radiation in metal.

Accordingly, the primary object of this invention is to provide an improved Schottky barrier focal plane array.

A further object of this invention is to provide a hybrid Schottky barrier array having an increased active sensing area.

These and other advantages, features and objects of this invention will become more apparent from the following description when taken in connection with the illustrative embodiments in the accompanying drawings.

DESCRIPTION OF THE PREFERRED EMBODIMENT

Figure 1:
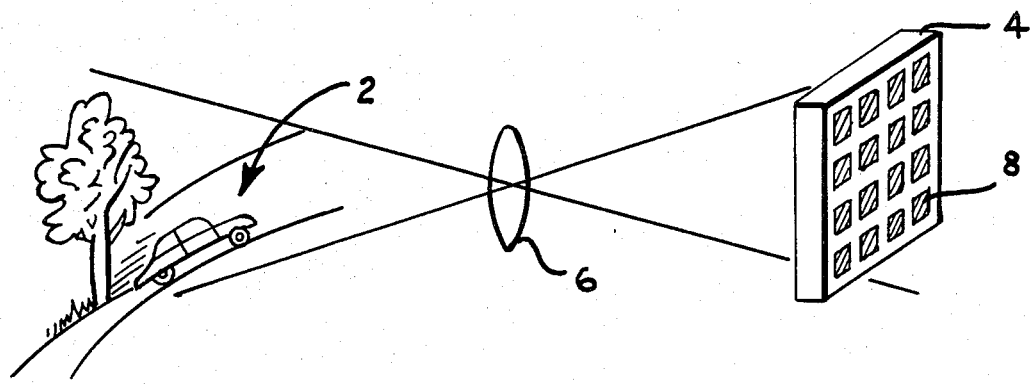
FIG. 1 is a pictorial representation of the basic elements of an infrared camera system.

Referring now to FIG. 1 of the drawings, there is shown a pictorial representation of the basic elements of a camera for infrared imaging wherein an infrared scene 2 is projected onto a semiconductor focal plane 4 by means of optics 6. Focal plane 4 includes an array of infrared sensitive photodiodes 8 in a two dimensional mosaic pattern. During an exposure or frame time a charge image is built up on the mosaic that is a replica of the observed scene. At the end of the frame, the charge image is read out as a video signal by means well known in the art.

Figure 2:
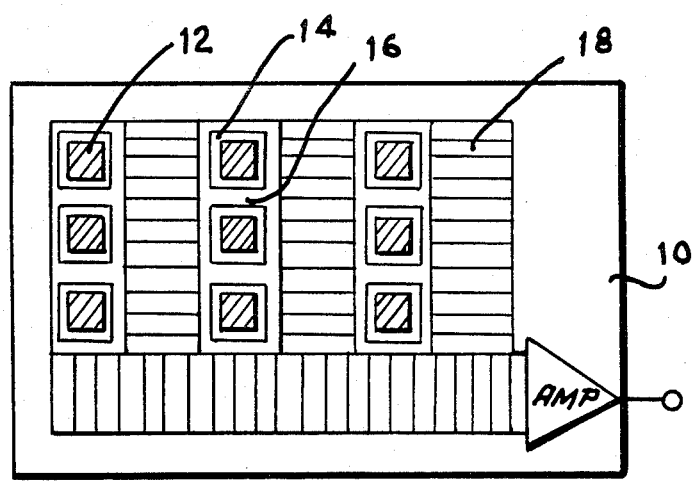
FIG. 2 is a diagrammatic representation of prior art Schottky infrared focal plane array.

FIG. 2 represents the component layout configuration of a prior art Schottky infrared focal plane array 10 such as that shown in U.S. Pat. No. 3,902,066 mentioned above. This is a monolithic device in which both sensing and multiplexing takes place within the focal plane. The array includes a number of infrared detectors 12, each having a guard ring 14 thereabout to minimize edge breakdown leakage. Channel stops 16 are used to isolate individual photodiodes from each other and from the charge coupled multiplexer network 18 which is used for signal readout. In such prior art devices, the charge coupled devices alone utilize up to 50% of the focal plane area.

Figure 3:
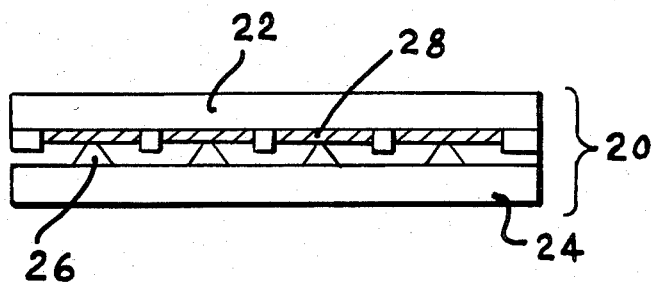
FIG. 3 is a diagrammatic representation of a hybrid focal plane array formed in accordance with the present invention.

FIG. 3 represents a hybrid focal plane array assembly 20 formed in accordance with the present invention in which a simple Schottky focal plane array 22 is bump-bonded to a separate multiplexer chip 24. Methods of making suitable bump bonds 26 to the Schottky photodiodes 28 are known in the art.

Figure 4:
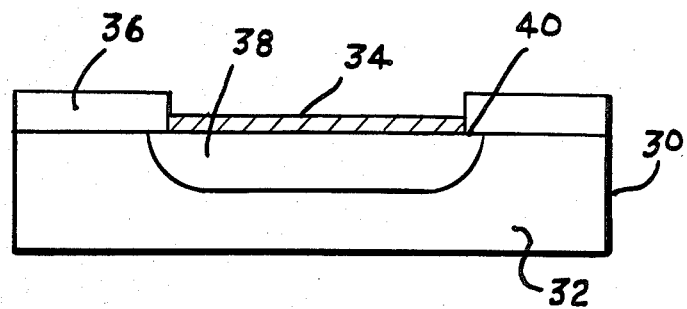
FIG. 4 is a diagrammatic representation of a basic Schottky photodiode without a guard ring.

FIG. 4 represents the schematic of a basic Schottky photodiode 30 including a substrate semiconductor 32, a Schottky metal photoelectrode 34 and an insulator 36. When the photodiode is fabricated, the differences in chemical potential between the metal and the semiconductor causes free charge to be swept from the semiconductor region that is immediately adjacent to the electrode. This process creates both the Schottky potential barrier at the metal-semiconductor interface and a high field depletion region 38 in the semiconductor. Electric field strengths at the edge of the Schottky electrode 40 can be extremely high and it is in this region where most device limiting dark currents and breakdown effects occur.

Figure 5:
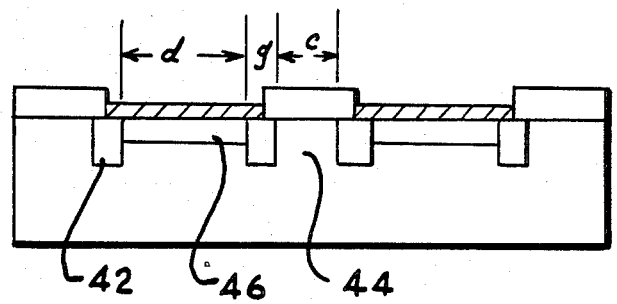
FIG. 5 is a diagrammatic representation of prior art Schottky photodiodes having guard rings.

FIG. 5 illustrates the conventional means for eliminating edge related dark currents. Guard rings 42 having widths in the order of 2 to 8 micrometers are formed by means of impurity diffusion or ion implantation at the edges of the photoelectrodes. Further, to prevent short circuiting between adjacent electrodes, a space or channel stop 44 is provided between guard rings. The depletion region is now confined to the area 46. As illustrated in FIG. 5, for a detector active area having dimension d, a guard ring width g, and a channel stop width c, the mosaic percent active area will be:

$$100 \times d^2/(d+2g+c)^2$$

It can therefore be seen that using channel stop widths of 1 to 5 micrometers, and guard ring widths of 2 to 8 micrometers, a percent active area of better than 70% is realized for typical device geometrics.

Figure 6:
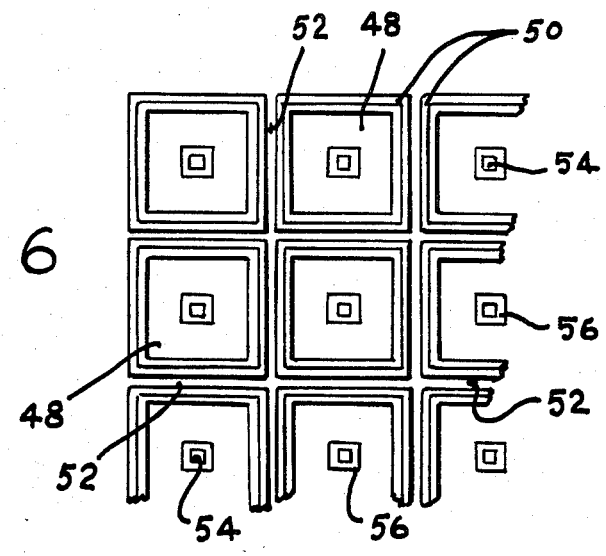
FIG. 6 is a diagrammatic representation of a portion of an improved Schottky hybrid focal plane array formed in accordance with the present invention.

FIG. 6 illustrates a portion of the improved hybrid focal plane array using guard ring structures. There the individual Schottky electrodes 48 are surrounded by guard rings 50. A spacing or channel stop 52 is provided between adjacent Schottky electrodes. To complete the structure oxide feed throughs 54 connect to bumb bonding pads 56 and substrate ohmic contacts are added by means well known in the art. A second semiconductor substrate containing multiplexing circuitry is then bonded to each of the bump landing pads. The semiconductor base material of the present invention is preferably silicon while the Schottky electrodes are preferably formed of platinum silicide or similar metal silicides.

Although the invention has been described with reference to a particular embodiment, it will be understood to those skilled in the art that the invention is capable of a variety of alternative embodiments within the spirit and scope of the appended claims.

What is claimed is:

1. A hybrid Schottky infrared internal photoemission focal plane array comprising:

a first semiconductor substrate having a first surface and an opposed second surface, said first semiconductor substrate being formed of silicon material;

a plurality of infrared sensitive metallic photodiodes arranged in a two-dimensional mosaic pattern on said first surface of said first semiconductor substrate;

each of said plurality of infrared sensitive metallic photodiodes comprising platinum silicide material formed at said first surface of said first semiconductor substrate to establish a Schottky potential barrier at the interface of said platinum silicide material and said silicon material of said first semiconductor substrate;

each of said plurality of infrared sensitive metallic photodiodes having a metallic bonding pad formed on said platinum silicide material for deriving an output signal therefrom;

each of said plurality of infrared sensitive metallic photodiodes being surrounded by a guard ring having a width of two to eight micrometers;

a channel stop having a width of one to five micrometers disposed between each said guard ring; and a second semiconductor substrate having a first surface and an opposed second surface, said second semiconductor substrate being formed of silicon material;

said second semiconductor substrate having multiplexing circuitry including a two-dimensional matrix of metallic signal input terminals formed on said first surface thereof for receiving and multiplexing input signals;

said metallic bonding pad of each of said plurality of infrared sensitive metallic photodiodes being directly and conductively bonded to a different one of said matrix of metallic signal input terminals of said second semiconductor substrate, whereby signals derived from each of said plurality of infrared sensitive metallic photodiodes are directly coupled to said multiplexing circuitry of said second semiconductor substrate.

* * * * *